(12) United States Patent
Schneider et al.

(10) Patent No.: US 11,842,889 B2
(45) Date of Patent: *Dec. 12, 2023

(54) DEVICE, METHOD AND USE FOR THE COATING OF LENSES

(71) Applicant: SCHNEIDER GMBH & CO. KG, Fronhausen (DE)

(72) Inventors: Gunter Schneider, Marburg (DE); Markus Fuhr, Erlensee (DE)

(73) Assignee: SCHNEIDER GMBH & CO. KG, Fronhausen (DE)

( * ) Notice: Subject to any disclaimer, the term of this patent is extended or adjusted under 35 U.S.C. 154(b) by 16 days.

This patent is subject to a terminal disclaimer.

(21) Appl. No.: 16/469,266

(22) PCT Filed: Nov. 16, 2017

(86) PCT No.: PCT/EP2017/079432
§ 371 (c)(1),
(2) Date: Dec. 17, 2019

(87) PCT Pub. No.: WO2018/108432
PCT Pub. Date: Jun. 21, 2018

(65) Prior Publication Data
US 2020/0140992 A1    May 7, 2020

(30) Foreign Application Priority Data

Dec. 14, 2016 (DE) ..................... 10 2016 014 835.7
Dec. 16, 2016 (DE) ..................... 10 2016 014 982.5
Dec. 21, 2016 (DE) ..................... 10 2016 125 278.6

(51) Int. Cl.
*H01J 37/34*    (2006.01)
*C23C 14/34*    (2006.01)
(Continued)

(52) U.S. Cl.
CPC ...... *H01J 37/3417* (2013.01); *C23C 14/3464* (2013.01); *C23C 14/35* (2013.01);
(Continued)

(58) Field of Classification Search
CPC .. H01J 37/347; H01J 37/3417; H01J 37/3405; H01J 37/32715; H01J 37/32403;
(Continued)

(56) References Cited

U.S. PATENT DOCUMENTS 4,226,208 A    10/1980    Nishida et al.
4,816,133 A    3/1989    Barnett
(Continued)

FOREIGN PATENT DOCUMENTS

DE    4010495 A1    10/1991
DE    19501804 A1    7/1996
(Continued)

OTHER PUBLICATIONS

Derwent Abstract EP 0723036 (Year: 1996).*
(Continued)

*Primary Examiner* — Michael A Band
(74) *Attorney, Agent, or Firm* — David S. Safran; Calderon Safran & Cole P.C.

(57) ABSTRACT

A device, a method, and a use for coating lenses are proposed, wherein the lenses to be coated are arranged in pairs over parallel, tubular targets. The distance of the targets to each other and/or to the lenses is varied for individual adaption. Further, the lenses are coated from both sides.

19 Claims, 4 Drawing Sheets

(51) Int. Cl.

| | | |
|---|---|---|
| *C23C 14/35* | (2006.01) | |
| *H01J 37/32* | (2006.01) | |
| C23C 14/50 | (2006.01) | |
| C23C 14/56 | (2006.01) | |
| G02B 1/10 | (2015.01) | |
| G02B 1/14 | (2015.01) | |
| G02B 1/18 | (2015.01) | |
| G02B 1/11 | (2015.01) | |

(52) U.S. Cl.
CPC ...... *C23C 14/352* (2013.01); *H01J 37/32715* (2013.01); *H01J 37/32779* (2013.01); *H01J 37/3405* (2013.01); *H01J 37/3423* (2013.01); *C23C 14/505* (2013.01); *C23C 14/568* (2013.01); *G02B 1/10* (2013.01); *G02B 1/11* (2013.01); *G02B 1/14* (2015.01); *G02B 1/18* (2015.01); *H01J 37/32899* (2013.01); *H01J 37/347* (2013.01); *H01J 2237/20214* (2013.01)

(58) Field of Classification Search
CPC .......... H01J 37/32899; H01J 37/32779; C23C 14/35; C23C 14/50; C23C 14/564; C23C 14/568; C23C 14/3464; C23C 14/352; C23C 16/4401; C23C 14/505
See application file for complete search history.

(56) References Cited

U.S. PATENT DOCUMENTS

| | | | |
|---|---|---|---|
| 5,106,346 A | 4/1992 | Locher et al. | |
| 5,597,609 A | 1/1997 | Beisswenger et al. | |
| 5,783,055 A | 7/1998 | Kamei et al. | |
| 5,814,195 A | 9/1998 | Lehan et al. | |
| 5,879,519 A | 3/1999 | Seeser et al. | |
| 5,911,861 A | 6/1999 | Dubs et al. | |
| 6,123,814 A | 9/2000 | Dubs et al. | |
| 6,187,159 B1 | 2/2001 | Kamura et al. | |
| 6,206,975 B1 | 3/2001 | Rick et al. | |
| 6,250,758 B1 | 6/2001 | Yoshihara et al. | |
| 6,264,751 B1 | 7/2001 | Kamura et al. | |
| 6,365,010 B1 | 4/2002 | Hollars | |
| 6,416,639 B1 | 7/2002 | De Bosscher et al. | |
| 9,840,373 B2 | 12/2017 | Schneider | |
| 10,424,468 B2 * | 9/2019 | De Bosscher | C23C 14/542 |
| 2001/0017261 A1 | 8/2001 | Walls et al. | |
| 2004/0031442 A1 | 2/2004 | Yamazaki et al. | |
| 2004/0089537 A1 | 5/2004 | Breme | |
| 2004/0182701 A1 * | 9/2004 | Miyamura | C23C 14/568 |
| | | | 204/298.26 |
| 2005/0109616 A1 | 5/2005 | Ohta et al. | |
| 2006/0196414 A1 | 9/2006 | Schuhmacher et al. | |
| 2006/0278519 A1 | 12/2006 | Malaszewski et al. | |
| 2008/0127887 A1 | 6/2008 | Leung et al. | |
| 2011/0024284 A1 * | 2/2011 | Schloremberg | H01J 37/3417 |
| | | | 204/192.12 |
| 2011/0127157 A1 | 6/2011 | Bellido-Gonzalez | |
| 2011/0132260 A1 | 6/2011 | Yamazaki et al. | |
| 2012/0315395 A1 | 12/2012 | Kuribe et al. | |
| 2013/0036970 A1 | 2/2013 | Choi et al. | |
| 2013/0061805 A1 | 3/2013 | Jin et al. | |
| 2014/0262752 A1 | 9/2014 | Vergohl et al. | |
| 2015/0053530 A1 | 2/2015 | Schneider | |
| 2016/0189939 A1 | 6/2016 | Deppisch et al. | |
| 2018/0312964 A1 * | 11/2018 | Schneider | B29D 11/00865 |

FOREIGN PATENT DOCUMENTS

| | | | |
|---|---|---|---|
| DE | 10145201 C1 | 11/2002 | |
| DE | 102013208771 A1 | 11/2014 | |
| DE | 102013109078 A1 * | 2/2015 | ............. C23C 14/22 |
| EP | 0913714 A1 | 5/1999 | |
| EP | 0928977 A1 | 7/1999 | |
| EP | 0945524 A1 | 9/1999 | |
| EP | 1101836 A1 | 5/2001 | |
| EP | 2280407 A2 * | 2/2011 | ......... C23C 14/3407 |
| JP | S60204882 A | 10/1985 | |
| JP | H06264104 A | 9/1994 | |
| JP | H10317135 A | 12/1998 | |
| JP | 2001355068 A | 12/2001 | |
| JP | 2003183823 A * | 7/2003 | |
| JP | 2006131973 A | 5/2006 | |
| JP | 2006171204 A | 6/2006 | |
| JP | 2008069402 A | 3/2008 | |
| JP | 2010199517 A | 9/2010 | |
| JP | 2012158835 A | 8/2012 | |
| JP | 2013249489 A | 12/2013 | |
| JP | 2014074188 A * | 4/2014 | ......... C23C 14/3407 |
| JP | 2015045087 A | 3/2015 | |
| KR | 100519707 B1 | 10/2005 | |
| WO | 9323176 A1 | 11/1993 | |
| WO | 02/063074 A1 | 8/2002 | |
| WO | 03023813 A1 | 3/2003 | |
| WO | 2017216065 A1 | 12/2017 | |

OTHER PUBLICATIONS

Machine Translation EP 0723036 (Year: 1996).*
Machine Translation JP2014074188 (Year: 2014).*
Anonymous, "Optical Parts Process Manual", vol. II, National Defence Industry Press, Beijing, China, Nov. 1977, 10 pages.
Li, "Vacuum film plating technology and device", Northeastern University of Technology Press, Liaoning Province, China, Oct. 1989, 18 pages.

* cited by examiner

DEVICE, METHOD AND USE FOR THE COATING OF LENSES

BACKGROUND OF THE INVENTION

Field of the Invention

The present invention relates to a device for coating lenses, a use of two targets for coating lenses and a method for coating lenses.

The present invention relates in general to the coating of lenses by sputtering, which is also referred to as cathode sputtering. In this connection, atoms are removed from a solid, the so-called target, by the impact of high-energy ions, and enter a gaseous phase. In particular, the present invention relates to the so-called magnetron sputtering, in which in addition to an applied electrical field, also a magnetic field is arranged behind the cathode and/or the target.

In practice, it is difficult to achieve a uniform coating of the lens to be coated, even though many different devices and methods for sputtering are known from the state of the art.

Description of Related Art

International Patent Publication WO 03/023813 A1 discloses an apparatus for coating lenses by pulsed magnetron sputtering, the lenses being moved linearly along the longitudinal extension of two tubular targets that run parallel and, in this case, also rotate. Here, a uniform coating of the lenses cannot be achieved or in any case achieved only with much difficulty.

SUMMARY OF THE INVENTION

An object of the present invention is to provide a device, a use, and a method for coating lenses, wherein a very uniform and/or efficient coating, in particular of curved surfaces of the lenses with simple design and/or with simple loading, is made possible.

The above object is achieved by a device, a use, and/or a method as described. Advantageous further developments are the subject matter of the subclaims.

According to one aspect of the present invention, the device for coating lenses is preferably designed in such a way that the targets can be adjusted in order to adjust or to adapt the distance from at least one lens to be coated and/or the distance from the targets to each other. Thus, the coating behavior can be very easily adapted to the lens(es) to be coated in each case, in particular also taking into consideration the surface(s) to be coated. For example, in this way, it can be taken into consideration whether the surface is convex or concave and/or how much the surface is curved. Consequently, the production of a coating that is as uniform as possible on the surface or lens to be coated is made possible or at least facilitated.

The targets or the sputtering sources with the targets are preferably restraint-guided, in particular adjustably guided in a slotted guide, in order to facilitate or to ensure a defined adjustment. This is in turn conducive to a defined coating of the lenses.

The targets or sputtering sources are preferably adjustable in a symmetrical manner to a center plane of the device or targets. This is in turn conducive to a defined coating, since in particular also the lenses to be coated are arranged symmetrically to this center plane for the coating, especially preferably in a plane that is parallel to the common plane of the targets.

The targets or sputtering sources are preferably adjustable obliquely to a center plane of the device or targets. This is in turn conductive to a defined adjustment and thus to a defined coating behavior.

The targets or sputtering sources are preferably adjustable by means of an adjustment drive, thus in particular motor-driven. This is conducive to a defined and, if necessary, also fast adjustment, in particular depending on the respective lenses to be coated.

Especially preferably, a common adjustment drive for common adjustment of the two targets or sputtering sources is assigned to the targets or two targets.

A proposed use of two preferably elongated and/or tubular, parallel targets for coating of curved surfaces of lenses is characterized in particular in that the targets are adjusted for changing the distance from at least one lens to be coated and/or the distance from the targets to each other in order to be able to adapt the coating behavior in particular to the lens(es) to be coated. This yields corresponding advantages.

According to another, also independently achievable aspect of the present invention, one or more targets are adjusted by means of an adjustment drive, in particular together, relative to at least one lens to be coated and/or to one another, in order to the coating behavior especially preferably individually to the respective lens(es) to be coated. This, in turn, yields corresponding advantages.

According to another, also independently achievable aspect of the present invention, a proposed device and a proposed method are characterized in that a two-sided coating of the at least one lens to be coated in the (same) device or coating chamber is carried out in particular with targets arranged on opposite sides. This is in turn conducive to a very simple and/or efficient coating.

Preferably, the device has at least one elongated or tubular target, and the lens to be coated can be rotated around an axis that is stationary relative to the targets.

In particular, during coating, the lens cannot be moved in a linear manner but rather it is preferably a stationary arrangement, the target and the lens preferably rotating each around stationary axes. Thus, an especially uniform coating of the lens can be achieved at low construction effort.

Preferably, the lens to be coated is held over a target preferably both in a first, at least essentially homogeneous region and in a second, inhomogeneous region of a rate profile of the removal of the target and at the same time is rotated. Thus, an especially uniform coating in particular of a curved surface of the lens is made possible.

In particular, the lens to be coated is held in an end region or its vicinity over the preferably elongated or tubular target. Thus, an especially good utilization of the emission rate that is increased specifically towards the end of the target and thus an improved utilization of the atomized target material can be made.

Preferably, two elongated and/or tubular, in particular parallel, targets are preferably used for coating curved surfaces of lenses, wherein the lenses are arranged in pairs over the targets and preferably rotate each around a stationary axis. This makes possible a simple, compact structure wherein very uniform coatings of the lenses can be achieved.

The above-mentioned aspects as well as the features and aspects of the present invention that follow from the further description can be implemented independently of one another, but also in any combination.

Further aspects, advantages, and features of the present invention follow from the claims and the following description of a preferred embodiment with reference to the accompanying drawings.

DETAILED DESCRIPTION OF THE INVENTION

Figure 1:
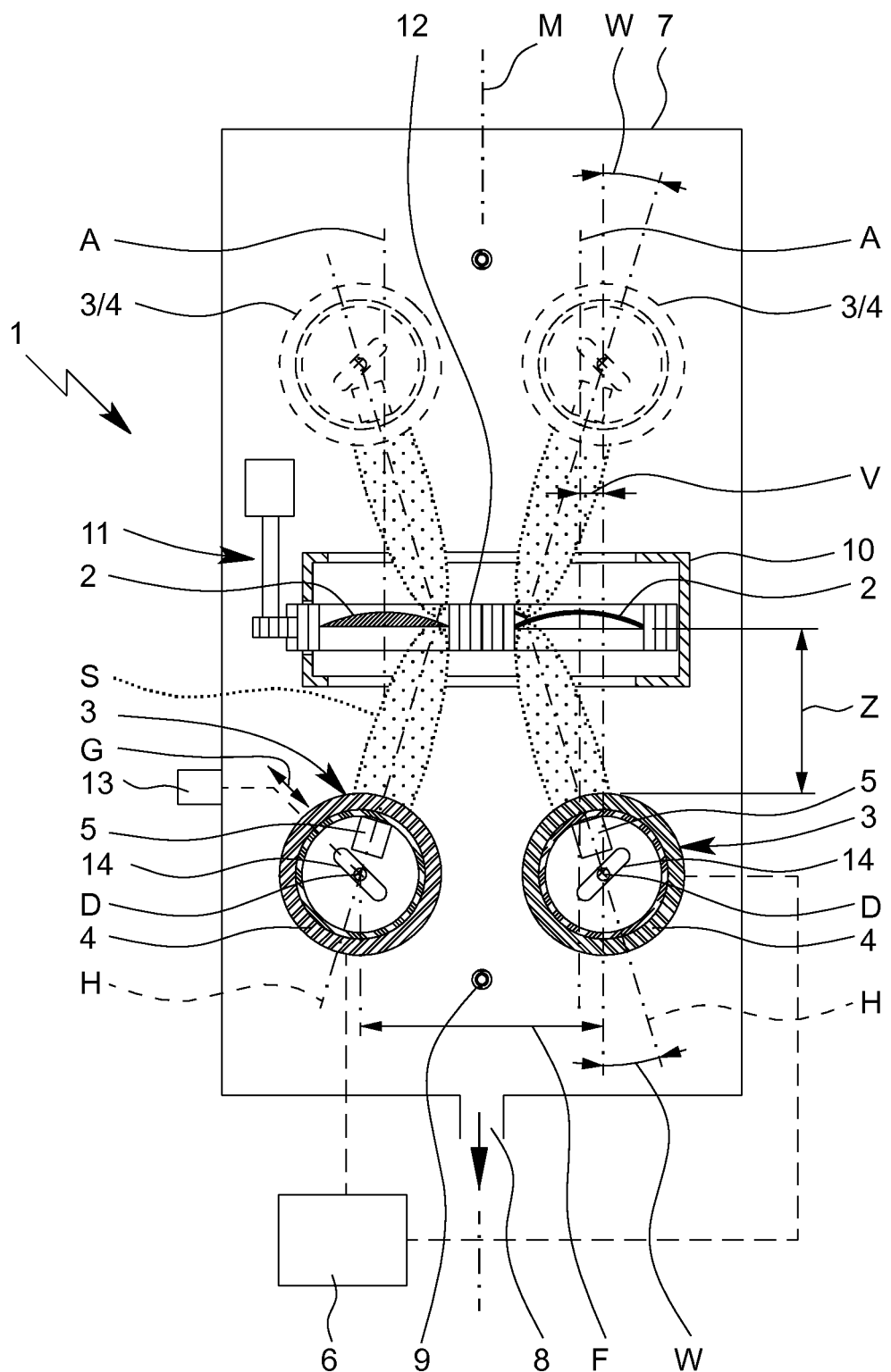
FIG. 1 shows a schematic section of a proposed device for coating lenses.

In a very schematic section, FIG. 1 shows a proposed device 1 for coating lenses 2, preferably optical and/or ophthalmic lenses and/or eyeglass lenses, in particular made of plastic.

The device 1 is designed in particular for coating lenses 2 by sputtering, also called cathode sputtering. Especially preferably, a so-called magnetron sputtering is carried out. In addition to an electrically-applied field, in this case a magnetic field is also used and/or applied, which will be explained later on in somewhat more detail.

Especially preferably, curved, in particular concave, surfaces of the lenses 2 are coated according to the invention. In FIG. 1, such a curved surface is indicated schematically for the lens 2 that is depicted on the right side. However, in principle, also convex surfaces or other surfaces of the lenses 2 can be coated correspondingly.

The device 1 has at least one sputtering source 3, here preferably two sputtering sources 3.

The device 1 or the respective sputtering source 3 has a target 4, whose material is removed during coating and/or sputtering and—in particular together with other components of the gas atmosphere—forms the desired coating on the respective lens 2 or its surface to be coated.

Figure 2:
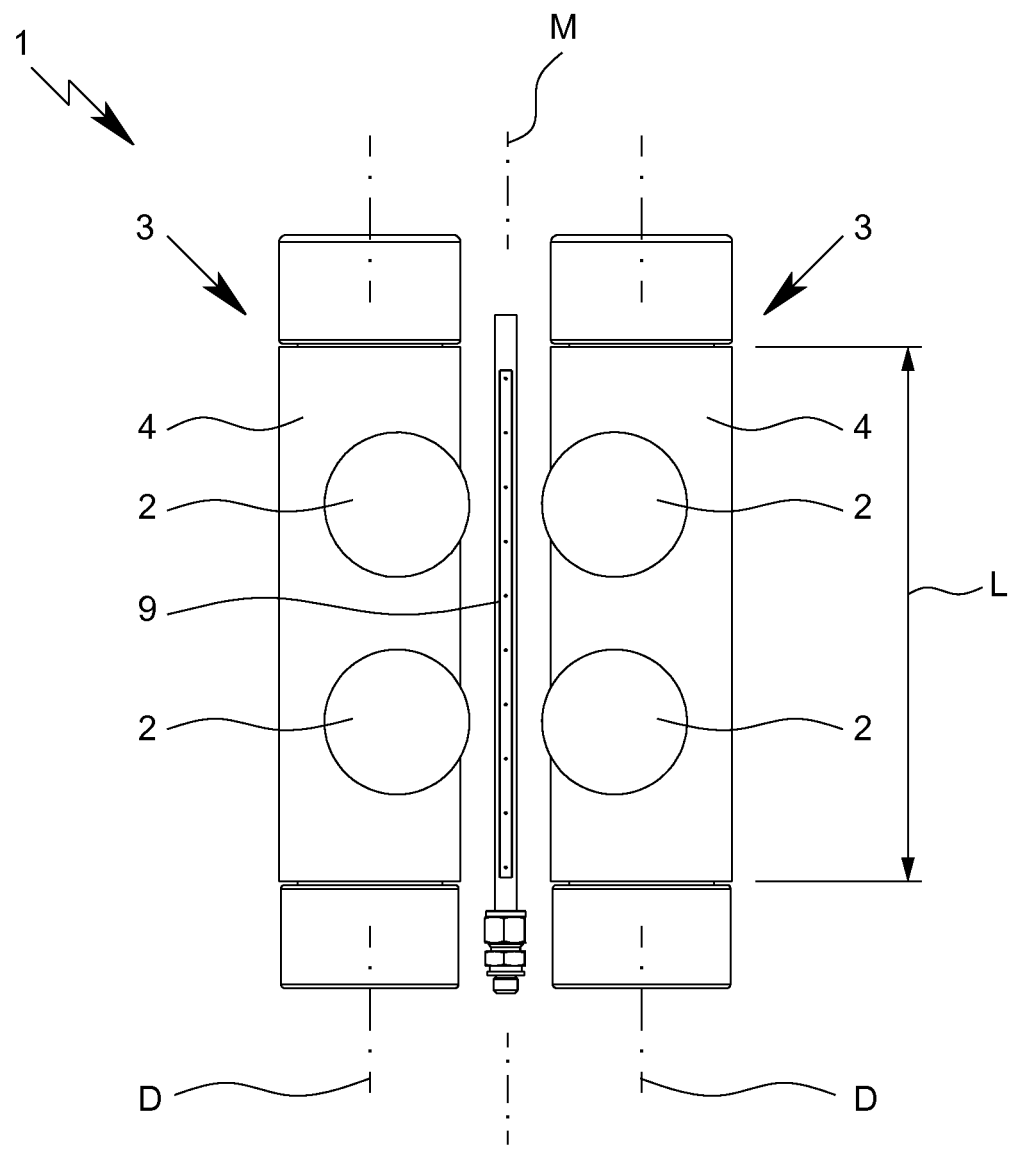
FIG. 2 shows a schematic top view of the device.

FIG. 2 shows the device 1 and/or sputtering sources 3 in a schematic top view.

In the illustrative example, the sputtering sources 3 and/or targets 4 are designed preferably at least essentially elongated and/or tubular or cylindrical.

The targets 4 are designed in particular as hollow cylinders and/or tubes.

The sputtering sources 3 and/or targets 4 are preferably arranged parallel to one another.

Preferably, the targets 4 can turn or rotate around axes of rotation D. The axes of rotation D preferably run in a common plane and/or in particular parallel to one another, as indicated in FIGS. 1 and 2, but also can alternatively be inclined toward one another. The axes of rotation D preferably correspond to the longitudinal axes of the sputtering sources 3.

Especially preferably, the sputtering sources 3 and/or targets 4 are constructed in the same way and/or identically, so that below primarily only the structure of one sputtering source 3 and/or one target 4 is explained. However, the sputtering sources 3 and/or targets 4 can also in principle be designed differently.

The sputtering source 3 preferably has a magnet arrangement 5, which is assigned to the respective target 4 for producing the already mentioned magnetic field and thus a directed sputtering cloud S, as schematically indicated in FIG. 1. In particular, the magnet arrangement 5 is arranged below and/or in the respective target 4.

The device 1 has a voltage source 6, as indicated in FIG. 1, in order to be able to operate the sputtering sources 3 and/or targets 4 as cathode—in particular alternately—and/or to be able to apply the necessary voltage to the sputtering sources 3 and/or targets 4 for sputtering, in particular in the form of pulses.

Especially preferably, the sputtering sources 3 and/or targets 4 are operated or supplied alternately with direct current (pulses). This is also referred to as "bi-polar DC". Alternately, one sputtering source 3 and/or one target 4 is then used as a cathode, and the other sputtering source 3 and/or the other target 4 is used as an anode.

Alternatively, an operation with alternating current or some other operation can be carried out.

Alternatively or in addition, one or more additional or separate anodes can also be used, even if this is not preferred.

The device 1 preferably has a coating chamber 7, in which the coating takes place and/or the sputtering sources 3 are arranged.

The preferred alternating operation of the sputtering sources 3 and/or targets 4 as cathode and anode has the effect that no housing-side or fixed counter electrode is necessary. In particular, the coating chamber 7 is not used as a counter electrode. In this way, an undesirable soiling and/or depositing of target material on the counter electrode can be minimized and/or an especially stable method or coating can be achieved also independently of a soiling of the coating chamber 7. Consequently, in this way, the amount of cleaning and maintenance needed can be reduced.

Further, the targets 4 can be very easily changed. This also facilitates the service.

The coating chamber 7 can be evacuated in particular by means of an apparatus 8 that is indicated only schematically here, such as a connection, a vacuum pump, or the like, in a desired way, preferably into a high vacuum and/or at a pressure of below 0.1 Pa.

The apparatus or vacuum pump 8 is arranged in particular on the side of the sputtering sources 3 and/or targets 4 facing away from the carrier 10 and/or the lenses 2 and/or preferably in a center plane M of the device 1 and/or coating chamber 7 or targets 4.

The device 1 and/or coating chamber 7 preferably has a schematically-indicated gas supply 9, in particular in the form of a gas lance that extends into the coating chamber.

The gas supply 9 is preferably arranged below the sputtering sources 3 and/or targets 4 and/or in between, especially preferably in the center plane M of the device 1 and/or coating chamber 7.

The gas supply 9 is preferably designed tubular and/or rod-like and/or is provided with gas outlets that are preferably arranged in a series and/or that point upward.

The device 1 preferably has a carrier 10 for holding the lenses 2, as indicated in FIG. 1.

In FIG. 2 and in further figures, the carrier 10 is not depicted for reasons of illustration.

The lenses 2 to be coated preferably each are turnable or rotatable around an axis A. The device 1 and/or the carrier 10 is designed for corresponding rotatable holding and in particular for corresponding driving of the lenses 2. In particular, the device 1 has a corresponding rotary drive 11, indicated only schematically in FIG. 1, preferably to drive all lenses 2 of the carrier 10 together.

The carrier 10 can preferably be changed together with at least two lenses 2 or all lenses 2 or, here, four lenses 2, which are coated simultaneously in the device 1 and/or coating chamber 7.

In particular, the carrier 10 holds the lenses 2 rotatably, in particular around their own and/or different axes A, especially preferably coupled rotatably. Especially preferably, the carrier 10 has a rotary coupling 12, for example via a corresponding gear, as schematically indicated in FIG. 1.

Preferably, the carrier 10 itself is not moved during the coating, but only the lenses 2 held thereon are rotated. Upon inserting or sliding the carrier 10 into the device 1 and/or coating chamber 7, the carrier 10 can preferably be coupled automatically in terms of drive or gear, in particular with the rotary drive 11 or the like of the device 1.

The carrier 10 allows for a fast loading of the device 1 and/or coating chamber 7 with the lenses 2 to be coated and/or a fast removal of the coated lenses 2.

The device 1 and/or coating chamber 7 can preferably be loaded via an access opening, not depicted, with the lenses 2 to be coated and/or the carrier 10. The access opening can preferably be closed by means of the carrier 10 or by a closure, not depicted, in particular in a gas-tight manner.

For coating, the coating chamber 7 can preferably be closed in a gas-tight manner.

The carrier 10 can preferably be used in general in devices for coating lenses 2, in particular also in the case of coating methods other than sputtering.

The axes of rotation D and/or the longitudinal extensions L of the targets 4 preferably run in a common plane, especially preferably a vertical or horizontal plane.

The lenses 2 are preferably arranged above or on a side of the previously-mentioned plane.

Preferably, each lens 2 is arranged over an assigned target 4. The term "over" can refer to the vertical height relative to the assigned target 4 and/or can denote that the surface of the lens 2 to be coated has at least one surface normal, which intersects the target 4 and especially preferably the axis of rotation D thereof.

Preferably, the lenses 2 are assigned in pairs to a sputtering source 3 and/or a target 4.

Figure 3:
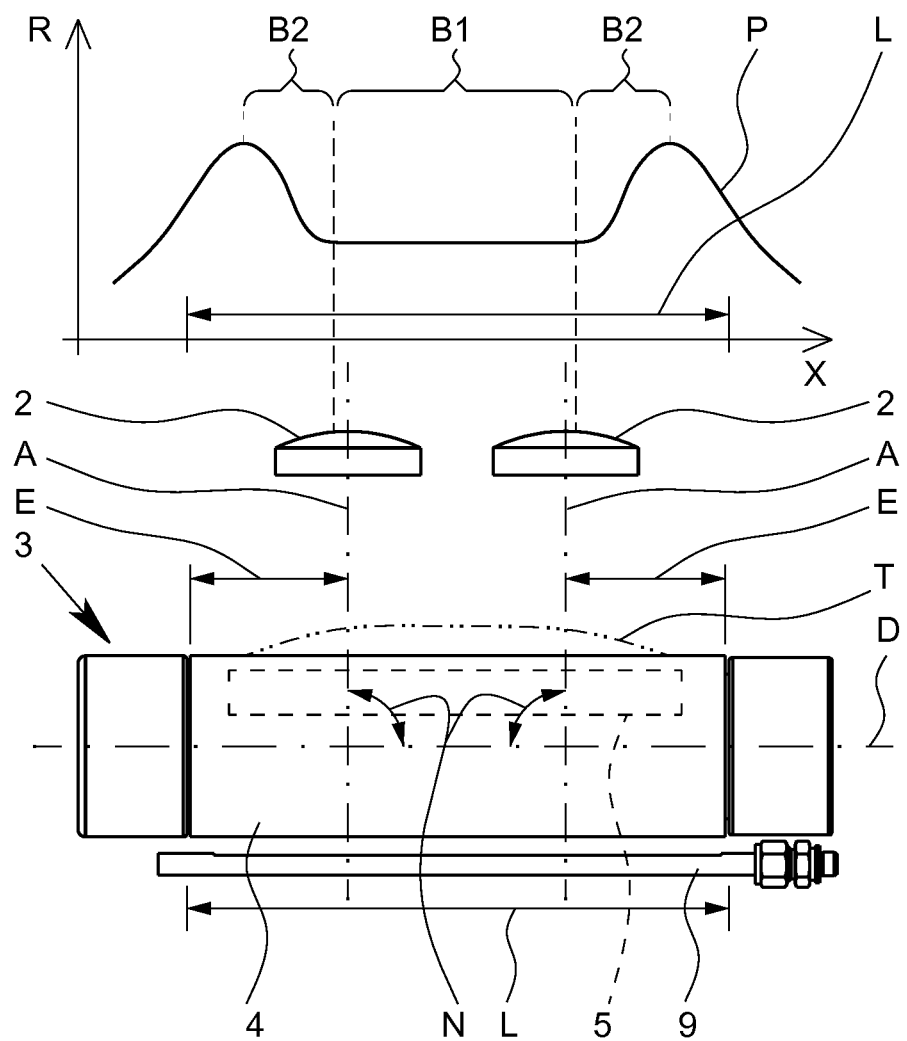
FIG. 3 shows a schematic side view of the device with a diagrammatically indicated rate profile.

In particular, two lenses 2 are arranged over a common target 4, respectively, as indicated in FIG. 2 and in the schematic side view according to FIG. 3.

Especially preferably, the device 1 and/or the carrier 10 is designed for receiving two pairs of lenses 2, i.e., a total of four lenses 2, wherein two lenses 2 are assigned to a common sputtering source 3 and/or a common target 4, respectively. Below, the preferred arrangement and orientation of such a pair of lenses 2, which are assigned to a common target 4, are discussed in more detail. These statements and explanations apply in particular in a corresponding manner for the other pair of lenses 2, since the device 1 and/or the arrangement of lenses 2 in the device 1 and/or the arrangement of sputtering sources 3 and/or targets 4 is especially preferably as symmetrical as possible relative to a center plane M—in FIGS. 1 and 2 of the center plane M that is perpendicular to the drawing plane.

The lenses 2 that are assigned to a common target 4 are preferably arranged offset in a direction that is parallel to the longitudinal extension L and/or the axis of rotation D of the target 4. This direction is also referred to as the X direction or X axis in particular in the diagram that is indicated schematically in FIG. 3.

The lenses 2 and/or their axes A are preferably arranged symmetrically relative to the longitudinal extension L of the target 4 and/or have an offset or distance E from the respective end of the target 4 in the axial direction or X direction.

In particular, the lenses 2 are arranged in an end region or its vicinity of the respective target 4, as indicated in FIGS. 1 and 2.

The diagram in FIG. 3 qualitatively illustrates the rate R of the removal of the target 4 during coating as a function of the axial position or X position. Thus, a rate profile P of the rate R over X, i.e., in the direction of the longitudinal extension L of the target 4, is produced.

In the central axial region of the target 4, the rate profile P has a first, at least essentially homogenous region B1. The rate R is, thus, at least essentially constant in the first region B1 and/or varies along the axial extension of the target 4 in this region B1 at most only very slightly, in particular less than 5%. Preferably, "essentially constant" according to the invention is to be understood as the rate R along the longitudinal extension L—here in the region B1—varying by less than 5%.

The rate profile P further has a second, non-homogeneous or inhomogeneous region B2. In this second region B2, the rate R varies very greatly, increases greatly in particular toward the end of the target 4, especially preferably by more than 10%.

The rate R of the removal of the target 4 in the second region B2 that increases toward the end of the target 4 and/or the respective magnet arrangement 5 can be explained by the magnetic field strength that is increased in the end region.

FIG. 3 shows that in each case, a second region B2 in the above-mentioned sense adjoins the first region B1 on both sides and/or toward the respective end of the target 4.

The lenses 2 are preferably arranged each in such a way—here in the axial extension L and/or X direction over the target 4—that the lens 2 in each case is arranged both in the first region B1 and in the second region B2, or overlaps these regions. Especially preferably, the center and/or axis A of the respective lens 2 is arranged in the vicinity of the transition from the first region B1 to the second region B2. The deviation of the axis A from this transition is preferably less than 30%, in particular less than 20%, especially preferably less than 10% of the lens diameter.

It has been shown that by the previously-mentioned arrangement of the lens 2 both in the first region B1 and in the second region B2, taking into consideration the rotation of the lens 2 around the axis during coating, an especially uniform coating can be achieved.

The axis A, around which the lens 2 rotates during coating in each case, is preferably stationary or is fixed relative to the target 4 and/or the sputtering source 3 or the axis of rotation D. During the coating, the lens 2 is thus stationary to the target 4 or the targets 4, even when the lens 2 is optionally or preferably rotated.

In particular, a linear movement and/or a center-of-gravity movement, such as a circular movement, between the sputtering source 3 and/or the target 4 and/or the axes of rotation D, on the one hand, and the lens 2 or lenses 2 to be coated and/or the axes A, on the other hand, is avoided or rendered impossible. This is conducive to an especially simple design.

The offset or distance E of the axis of rotation A of the lens 2 from the respective end of the target 4 is preferably more than 1.0 times or 1.5 times the lens diameter and/or target diameter.

The distance E is preferably fixed. Optionally, an adaption or adjustment of the distance E of the axis of rotation A of the lens 2 from the respective end of the target 4 is carried out as a function of the diameter and/or the curvature and/or shape of the lens 2 or surface to be coated.

The (vertical) distance Z of the lens 2 from the assigned target 4 is indicated in FIG. 1 and is preferably more than 1.0 times the lens diameter or target diameter.

The (vertical) distance Z of the lens 2 from the assigned target 4 is preferably more than about 60 mm and/or less than 150 mm, in particular less than 130 mm.

The distance Z is preferably fixed. Optionally, a an adaption or adjustment of the (vertical) distance Z of the lens 2 from the assigned target 4 is carried out as a function of the diameter and/or the curvature and/or shape of the lens 2 or surface to be coated.

The target diameter is preferably about 70 to 130 mm.

Preferably, the target (outside) diameter is at least essentially constant over the length.

The target 4 is thus preferably designed cylindrical or hollow cylindrical.

The axes A of two lenses 2 that are assigned to a common target 4 preferably run in a common plane and in particular parallel to one another.

The axes A preferably run transversely or perpendicular to the target plane and/or common plane of the axes of rotation D and/or to the axis of rotation D of the assigned target 4.

The axes A can also be inclined relative to one another in their common plane, in particular toward one another or outward or away from one another. Accordingly, the lenses 2 are then moved closer together or further apart, in particular, if necessary, so that the surfaces of the two lenses 2 to be coated are somewhat tilted toward one another and/or point somewhat more toward the center of the respective target 4. Accordingly, the angle of inclination N of the axes A to the axes of rotation D can deviate from the preferred 90°, as depicted in FIG. 3, and can be either less than 90°, for example about 70° to 85°, or more than 90°, for example about 95° to 110°.

The angle of inclination N is preferably fixed. Especially preferably, however, optionally an adaption or adjustment of the angle of inclination N is carried out as a function of the diameter and/or the curvature or shape of the lens 2 and/or surface to be coated.

The axis of rotation A of the lens 2 can also be shifted in the Y direction, i.e., in a direction transversely to the axis of rotation D in the horizontal direction and/or to the center in between the two axes of rotation D of the targets 4, in particular so that an offset or distance V between the lens axis A and the assigned target axis D is formed, as indicated in FIG. 1 for the lens 2 arranged on the right side (the same preferably applies, of course, also for the lens 2 arranged on the left side). The offset or distance V is preferably less than 20%, in particular less than 10%, of the lens diameter and/or target diameter.

The distance V is preferably fixed. Optionally, an adaption or adjustment of the distance V between the lens axis A and the assigned target axis D is carried out as a function of the diameter and/or the curvature and/or shape of the lens 2 or surface to be coated.

Preferably, the angle of inclination N and/or the position of the axes A and/or the distances E, V, and/or Z are (also) determined by the carrier 10.

The sputtering sources 3 and/or targets 4 preferably lie in a common plane and/or preferably extend parallel to one another.

The distance F of the sputtering sources 3 and/or targets 4 and/or axes of rotation D is indicated schematically in FIG. 1. The distance F is especially preferably variable. Preferably, namely an adaption or adjustment of the distance F is carried out in an in particular lens-specific manner, especially preferably as a function of the diameter and/or the curvature and/or shape of the lens(es) 2 or surface(s) to be coated, thus, individually.

Especially preferably, the sputtering sources 3 and/or targets 4 can be adjusted to change the distance Z from the at least one lens 2 to be coated and/or the distance F of the targets 4 to each other.

As an alternative or in addition, at least one sputtering source 3 and/or one target 4 can be adjusted relative to the lens 2, preferably by means of an adjustment drive 13, for in particular individual adaption of the distance Z and/or V and/or E and/or F.

The adjustment serves in particular to adapt the coating behavior to the (respective) lens 2.

The adjustment is carried out preferably before the coating, thus, in particular not during the coating. However, in principle, an—if necessary slow—adjustment is also possible during the coating for further evening-out of the applied coating.

The adjustment drive 13 preferably comprises a stepper motor or servomotor.

The adjustment drive 13 operates electrically, pneumatically, or hydraulically.

The adjustment drive 13 engages preferably via a gear, in particular a lever gear, especially preferably on the respective sputtering source 3 and/or axis of rotation D.

Especially preferably, (only) an adjustment of the sputtering sources 3 and/or targets 4 is carried out. As an alternative or in addition, an adjustment of the lenses 2, in particular of the carrier 10 with the lenses 2, is also possible.

Especially preferably, the adjustment drive 13 serves for common adjustment of the sputtering sources 3 and/or targets 4.

According to the proposed solution, "adjustment" is to be understood in particular as a movement G and/or a change in position, as indicated in FIG. 1 by way of example only for the lower left sputtering source 3 and/or the target 4 thereof.

Especially preferably, the sputtering sources 3 and/or targets 4 are adjustable (only) obliquely, linearly, in opposite directions and/or symmetrically to the center plane M.

Especially preferably, the sputtering sources and/or targets 4 are coupled in such a way, in particular via a lever gear or the like, that they can only be adjusted together and/or always remain oriented parallel to one another and/or always remain oriented with their common plane parallel to the main plane of the carrier 3 and/or the lenses 2 and/or can only be moved in parallel.

Especially preferably, the sputtering sources 3 and/or targets 4 are directed in an adjustable manner by means of a restricted guidance, in particular a slotted guide 14, as indicated only schematically in FIG. 1.

Preferably, the device 1 and the proposed method are designed in such a way that the lenses 2 can be or are coated on two sides—thus, on both and/or opposite sides. In particular, for this, the sputtering sources 3 and/or targets 4 are arranged on opposite sides of the carrier 10 and/or of the lens(es) 2 to be coated, as indicated schematically in FIG. 1 by the pair of sputtering sources 3 and/or targets 4 depicted additionally in dotted lines at the top.

Thus, in particular, a two-sided coating of the lens(es) 2 in the (same) device 1 and/or coating chamber 7 is possible.

The coating of the two sides can be carried out in succession or selectively also simultaneously.

In particular, a pair of sputtering sources 3 and/or targets 4 is arranged on each side of the carrier 10 and/or the lenses 2, respectively, wherein for each pair the above statements and subsequent statements apply, so that repetition in this regard can be omitted.

For the two-sided coating, the carrier 10 is preferably correspondingly open from both sides, so that the lenses 2 held thereon can be coated from both sides in a desired way, in particular without changing the gripping or mounting. For example, to this end, the carrier 10 is provided on its opposite sides with corresponding openings. For example, annular gearwheels and/or holding elements or other elements for holding lenses 2 on their peripheries are used, wherein these elements preferably form or make possible the rotary coupling 12 at the same time.

Optionally, each side and/or the sputtering sources 3 and/or targets 4 that are arranged on opposite sides each has/have a separate gas supply 9 and/or a separate apparatus or vacuum pump 8, voltage source 6, and/or adjusting mechanism, such as a holding drive 13. However, in principle components or parts, such as the voltage source 6 or vacuum pump 8, can also be used together or alternately.

The sputtering cloud S that occurs during coating, i.e., the sputtered target material, is in each case directed at least essentially in a desired direction by means of the already-mentioned magnetic field or the magnet arrangement 5. This main direction H of the expansion of the sputtering cloud S, indicated in dotted lines in FIG. 1, can be influenced, in particular can be established, by corresponding arrangement and/or orientation of the magnet arrangement 5.

In the illustrative example, the main direction H in the sectional plane perpendicular to the axes of rotation D and/or the two targets 4 is preferably inclined to one another and/or by the angle W (starting from a parallel orientation). Preferably, the angle W can be adjusted or adapted, in particular by corresponding adjustment or control of the magnet arrangements 5.

The angle W is preferably less than 10°, in particular less than 7°, especially preferably less than 5°.

As already mentioned, the main directions H of the two sputtering clouds S can also run parallel to one another and/or perpendicular to the extension plane of the targets 4 and/or plane with the axes of rotation D.

Preferably, the main directions H run vertically upward or contain one such direction component. As an alternative, a horizontal orientation of the main directions H occurs. The arrangement of the lenses 2 and sputtering sources 3 and/or targets 4 must then, of course, be selected in a corresponding manner.

Preferably, the lenses 2 in the proposed device 1 and in the proposed method are each held both in the first region B1 and in the second region B2, and at the same time are rotated. In this way, an especially uniform coating can be achieved.

Figure 4:
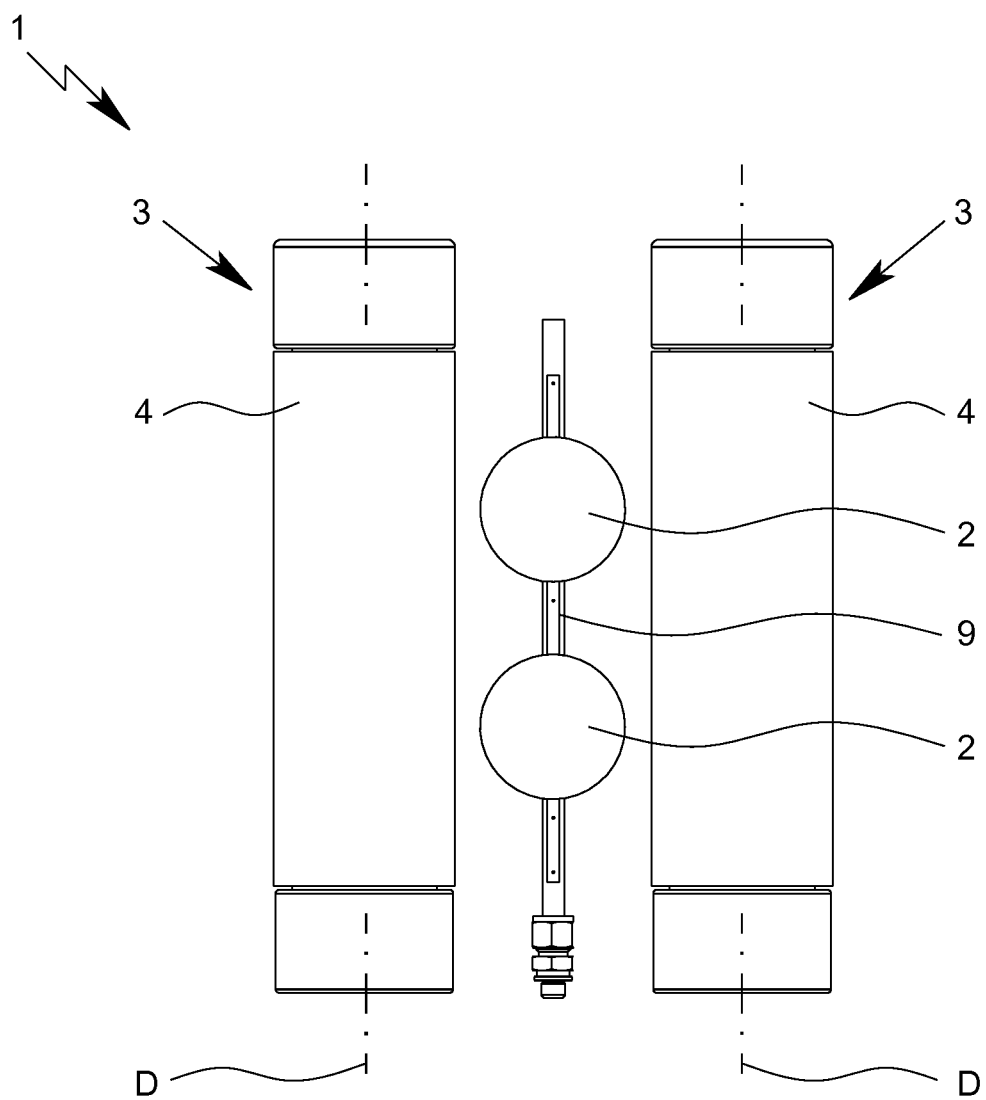
FIG. 4 shows a schematic top view of the device corresponding to FIG. 2, but with alternatively arranged lenses.

Especially preferably, the lenses 2 are coated in pairs, respectively; in particular, two pairs of lenses 2 are, respectively, coated simultaneously. In principle, however, it is also possible to coat only one pair of lenses 2 in the device 1 according to the proposed solution. To this end, the two lenses then preferably are arranged over a common target 4 and/or between the two targets 4, as shown schematically in FIG. 4 in an alternative arrangement.

Preferably, the rate profile P is not influenced or homogenized by distribution screens or the like in the device 1 and/or coating chamber 7. This is advantageous in particular with respect to the undesirable depositing on such screens.

According to an also independently achievable aspect of the present invention, the outside diameter of the target 4 can vary over the axial extension or length or longitudinal extension L of the target 4, as schematically indicated in FIG. 3 by the double dotted dashed line or target surface T.

In particular, the target 4 can be designed, for example, thicker in the center than on the end regions and/or, for example, bulgy.

In the center and/or between the axes of rotation A of the lenses 2 and/or between the (otherwise forming) regions B2, the outside diameter of the target 4 is preferably at least essentially constant and/or, for example, by more than 4% larger than on the ends of the target 4, as indicated in FIG. 3.

In particular, the outside diameter can respectively be reduced or can decrease also only toward the end regions of the target 4, in particular in the regions B2 and/or only in the end region of less than 25% of the length L of the target 4.

In principle, the outside diameter in the longitudinal extension L can have any outline, if necessary also (partially) convex, concave or wavy.

The outside diameter of the target 4 preferably varies over the longitudinal extension or length L of the target 4 by more than 4%.

Especially preferably, the rate profile P is modified in a desired way, for example evened out, by variation of the outside diameter over the length L of the target 4.

Alternatively or in addition to the variation of the outside diameter, the magnetic field and/or the magnetic field strength of the magnet arrangement 5 can also vary over the length L of the target 4 and/or the sputtering source 3, in particular can respectively decrease toward the end and/or can be larger in the region of the center, in particular by more than 4%, in order to modify, especially preferably to even out, the rate profile P in a desirable way, and/or in order to achieve also in the case of varying outside diameter of the target 4 a specific and/or a desired and/or an at least essentially constant strength of the magnetic field on the target surface, in particular also taking into consideration the optionally varying outside diameter.

By the previously-mentioned variations of the outside diameter and/or magnetic field, the rate profile P is preferably evened out, modified, or established, in such a way that in particular taking into consideration the positioning of the lens 2 to be coated relative to the target 4 (for example, the position of the axis of rotation A of the lens 2 and the distance of the lens 2) and/or taking into consideration the shape and/or the size of the surface of the lens 2 to be coated, a desired coating of the lens 2, in particular uniform or defined in some other way, if necessary also nonuniform, for example the coating of the lens 2 increasing or decreasing toward the edge, can be achieved or is achieved.

The lenses 2 preferably rotate centrically around the respective axis A, in particular with respect to the geometric center of the lens 2.

According to a variant embodiment, not depicted, the lenses 2 can optionally also rotate and/or be mounted eccentrically with respect to the axis of rotation A. The eccentricity is in this case preferably less than the radius of the lens 2, if desired also can be greater.

In particular, the axis of rotation A thus intersects the respective lens 2.

The axis A preferably runs perpendicular to the main plane of the respective lens 2.

Each of the lenses 2 can preferably rotate around its own axis A.

The axis A preferably runs transversely, optionally perpendicular, to the longitudinal extension and/or axis of rotation D of the assigned target 4.

In particular, the axis of rotation A of the respective lens 2 intersects the assigned target 4, as indicated in FIG. 1, or optionally the longitudinal axis or axis of rotation D of the assigned target 4.

During the coating and/or rotation, the lens 2 preferably always points to the assigned target 4 or the two assigned targets 4 with its side to be coated.

The axis of rotation D of the respective target 4 preferably runs perpendicular to any surface normal or at least one surface normal of the lens 2 or surface to be coated.

The surface normal of the optical or geometric center of the lens 2 can be inclined toward the axis of rotation A and/or axis of rotation D.

The lens centers are preferably arranged symmetrically to the respective target 4 in the X direction and/or longitudinal extension of the target 4.

The lenses 2 to be coated and/or their geometric or optical centers are preferably arranged at least essentially in a common plane, wherein this plane especially preferably runs parallel to the extension plane of the sputtering sources 3 and/or targets 4 and/or axes of rotation D.

With the proposed device 1 and/or the proposed method and/or the proposed use of tubular, parallel targets 4 for coating lenses 2, preferably coating rates of 0.001 or 20 nm/s, in particular 0.005 nm/s to 2.5 nm/s, are achieved.

The rotational speed of the lens 2 is preferably 10 to 200 rpm, in particular about 40 to 120 rpm.

The diameter of the lenses 2 is preferably about 40 to 85 mm.

The rotational speed of the targets 4 is preferably about 3 to 30 rpm.

Preferably, the rotational speed of the lenses 2 is greater than that of the targets 4, in particular more than 2 or 3 times the rotational speed of the targets 4.

The coating time is preferably about 4 to 7 minutes.

The proposed device 1 and/or the proposed method and/or the proposed use is preferably used for application of one or more anti-reflective layers.

According to the proposed solution, in particular a reactive coating is carried out, wherein by corresponding feeding of reactive gas, for example nitrogen, hydrogen, and/or oxygen, to working gas (noble gas), in particular argon, the target material can react therewith and form a desired coating on the lens 2.

In particular, a device 1, a method, and a use for coating lenses 2 are proposed, wherein the lenses to be coated are arranged in pairs over parallel, tubular targets 4, in such a way that they each overlap both a homogeneous and an inhomogeneous removal region B1, B2 of the target 4, and wherein the lenses 2 rotate, so that an especially uniform coating can be achieved.

What is claimed is:

1. Device for coating lenses, by means of sputtering, comprising:
   at least two targets, and
   a carrier for holding at least one lens to be coated at a lens-target distance from the at least two targets,
   wherein the at least two targets are tubular,
   wherein the at least two targets are configured as only adjustable obliquely, linearly relative to a center plane extending between the at least two targets to change a position via slotted guide of the at least two targets by:
   the lens-target distance of the at least one lens to be coated; and/or
   a target-target distance of the at least two targets from each other.

2. Device according to claim 1, wherein the at least two targets are adjustable symmetrically to the center plane.

3. Device according to claim 1, wherein each of the at least two targets each are adjustably guided in a restricted guidance.

4. Device according to claim 1, wherein the at least two targets and/or axes of rotation of the at least two targets run parallel to one another.

5. Device according to claim 1, wherein the at least two targets are arranged on opposite sides of the at least one lens and/or the carrier.

6. Device according to claim 1, wherein two of the at least two targets are arranged on one side and two others of the at least two targets are arranged on an opposite side of the at least one lens and/or the carrier.

7. Device according to claim 1, wherein the at least one lens is an eyeglass lens.

8. Device according to claim 1, wherein the sputtering is magnetron sputtering.

9. Device according to claim 1, wherein the at least two targets are arranged on the same side of the at least one lens and/or the carrier.

10. Device according to claim 1, wherein the device or carrier provides an axis of rotation for rotating the at least one lens during coating, the axis of rotation being at a location that is fixed relative to the at least two targets.

11. Device according to claim 1, wherein the device is designed for two-sided coating of the at least one lens to be coated.

12. Device according to claim 1, wherein the device has an adjustment drive for common adjustment of the at least two targets.

13. Device for coating lenses, by means of sputtering, comprising:
    at least two targets, and
    a carrier for holding at least one lens to be coated at a lens-target distance from the at least two targets,
    wherein the at least two targets are elongated and/or tubular,
    wherein the at least two targets are configured as only adjustable obliquely, linearly relative to a center plane extending between the at least two targets to change a position via slotted guide of the at least two targets by:
    the lens-target distance of the at least one lens to be coated; and/or
    a target-target distance of the at least two targets from each other.

14. Device according to claim 13, wherein the device has an adjustment drive for common adjustment of the at least two targets.

15. Device according to claim 13, wherein the at least two targets are adjustable symmetrically to the center plane.

16. Device according to claim 13, wherein each of the at least two targets each are adjustably guided in a restricted guidance.

17. Device according to claim 13, wherein the at least two targets comprise each a longitudinal symmetry axis, the at least two targets being rotatable around respective symmetry axes during coating.

18. Device according to claim 13, further comprising an axis of rotation for rotating the at least one lens during coating, the axis of rotation being at a location that is fixed relative to the at least two targets.

19. Device according to claim 13, wherein the device is designed for two-sided coating of the at least one lens to be coated.

* * * * *